(12) United States Patent
Kim et al.

(10) Patent No.: US 11,744,119 B2
(45) Date of Patent: Aug. 29, 2023

(54) DISPLAY DEVICE INCLUDING A CONNECTION PATTERN

(71) Applicant: SAMSUNG DISPLAY CO., LTD., Yongin-si (KR)

(72) Inventors: Keon Woo Kim, Cheonan-si (KR); Deok-Young Choi, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 248 days.

(21) Appl. No.: 17/022,272

(22) Filed: Sep. 16, 2020

(65) Prior Publication Data
US 2021/0167150 A1    Jun. 3, 2021

(30) Foreign Application Priority Data
Nov. 28, 2019  (KR) .................. 10-2019-0155067

(51) Int. Cl.
| | | |
|---|---|---|
| *H10K 59/123* | (2023.01) | |
| *H10K 59/131* | (2023.01) | |
| *H01L 27/12* | (2006.01) | |
| *H10K 59/121* | (2023.01) | |

(52) U.S. Cl.
CPC ......... *H10K 59/123* (2023.02); *H10K 59/131* (2023.02); *H01L 27/1244* (2013.01); *H10K 59/1213* (2023.02)

(58) Field of Classification Search
CPC ............. H01L 27/3248; H01L 27/3276; H01L 27/1244; H01L 27/3262; H01L 2251/5392; H01L 51/52; H10K 59/123; H10K 59/131; H10K 59/1213; H10K 2102/341; H10K 50/80
USPC .......................................................... 257/99
See application file for complete search history.

(56) References Cited

U.S. PATENT DOCUMENTS

| | | | | |
|---|---|---|---|---|
| 2015/0102303 A1* | 4/2015 | Kim | ............... | H01L 27/3262 |
| | | | | 257/40 |
| 2017/0287938 A1* | 10/2017 | Lee | ............... | H01L 23/535 |
| 2018/0108677 A1* | 4/2018 | Yeh | ............... | H01L 27/1262 |
| 2019/0006442 A1 | 1/2019 | Byun et al. | | |
| 2019/0221165 A1 | 7/2019 | Park et al. | | |
| 2021/0210563 A1* | 7/2021 | Huang | ............... | H01L 27/3218 |

* cited by examiner

*Primary Examiner* — Nduka E Ojeh
*Assistant Examiner* — Laura M Dykes
(74) *Attorney, Agent, or Firm* — F. Chau & Associates, LLC

(57) ABSTRACT

A display device includes a pixel circuit, a first line disposed on the pixel circuit and a second line disposed on a same layer as the first line. A light emitting element is disposed on the first line and the second line. A connection pattern is disposed on a same layer as the first line and the second line and is disposed between the first line and the second line. The connection pattern connects the pixel circuit and the light emitting element. The connection pattern has a polygonal shape including at least six sides. A first vertex of the connection pattern is positioned at a shortest distance from the first line to the connection pattern and portions of the connection pattern between the first vertex and adjacent vertices are positioned farther from the first line than the first vertex.

20 Claims, 11 Drawing Sheets

DISPLAY DEVICE INCLUDING A CONNECTION PATTERN

CROSS-REFERENCE TO RELATED APPLICATION

This application claims priority under 35 U.S.C. § 119 to Korean Patent Application No. 10-2019-0155067, filed on Nov. 28, 2019 in the Korean Intellectual Property Office, the disclosure of which is incorporated by reference in its entirety herein.

1. TECHNICAL FIELD

The present inventive concepts relate to a display device.

2. DISCUSSION OF RELATED ART

A display device may include a plurality of pixels for displaying an image. The display device may include lines that provide signals, power, etc. for driving the pixels.

Recent developments in display devices have resulted in an increase in the number of the pixels per unit area due to the increase in the size and resolution of display devices. Accordingly, a gap between the lines providing signals, powers, etc. to the pixels decreases due to the increase in the number of the pixels per unit area. The decrease in the gap between the lines and the pixels may result in the occurrence of defects such as a short-circuit between the lines.

SUMMARY

Exemplary embodiments of the present inventive concepts provide a display device in which short-circuit defects are prevented.

According to an exemplary embodiment of the present inventive concepts, a display device includes a pixel circuit, a first line disposed on the pixel circuit, the first line extending in a first direction and a second line disposed on a same layer as the first line and extending in the first direction. The second line is spaced apart from the first line in a second direction that crosses the first direction. A light emitting element is disposed on the first line and the second line. A connection pattern is disposed on a same layer as the first line and the second line and is disposed between the first line and the second line in the second direction. The connection pattern is configured to connect the pixel circuit and the light emitting element. The connection pattern has a polygonal shape including at least six sides. A first vertex of the connection pattern is positioned at a shortest distance from the first line to the connection pattern and portions of the connection pattern between the first vertex and adjacent vertices are positioned farther from the first line than the first vertex.

In an exemplary embodiment, a second vertex of the connection pattern may be positioned at a shortest distance from the second line to the connection pattern.

In an exemplary embodiment, the connection pattern may include a first connection portion connected to the light emitting element and a second connection portion connected to the pixel circuit, and the first connection portion may have a diamond shape.

In an exemplary embodiment, the first vertex may be a vertex of the first connection portion.

In an exemplary embodiment, the second vertex may be a vertex of the first connection portion.

In an exemplary embodiment, the second connection portion may have a diamond shape.

In an exemplary embodiment, the second vertex may be a vertex of the second connection portion.

In an exemplary embodiment, the second connection portion may have a rectangular shape.

In an exemplary embodiment, the first line may be a data line providing a data signal to the pixel circuit.

In an exemplary embodiment, the second line may be a power line providing a power voltage to the pixel circuit.

In an exemplary embodiment, the display device may further include a first pixel and a second pixel positioned in a second direction crossing the first direction from the first pixel. The first line may be connected to the first pixel, and the second line may be connected to the second pixel.

In an exemplary embodiment, the light emitting element may include a first electrode, an emission layer disposed on the first electrode, and a second electrode disposed on the emission layer, and the connection pattern may be connected to the first electrode.

According to an exemplary embodiment of the present inventive concepts, a display device may include a pixel circuit, a first line disposed on the pixel circuit, the first line extending in a first direction and a second line disposed on a same layer as the first line and extending in the first direction. The second line is spaced apart from the first line in a second direction that crosses the first direction. A light emitting element is disposed on the first line and the second line. A connection pattern is disposed on a same layer as the first line and the second line and is disposed between the first line and the second line in the second direction. The connection pattern includes a first connection portion that is configured to connect the light emitting element and a second connection portion that is configured to connect the pixel circuit. The first connection portion has a diamond shape.

In an exemplary embodiment, a vertex of the first connection portion may be positioned at a shortest distance from the first line to the connection pattern.

In an exemplary embodiment, a vertex of the first connection portion may be positioned at a shortest distance from the second line to the connection pattern.

In an exemplary embodiment, the second connection portion may have a diamond shape.

In an exemplary embodiment, a vertex of the second connection portion may be positioned at a shortest distance from the second line to the connection pattern.

In an exemplary embodiment, the second connection portion may have a rectangular shape.

In an exemplary embodiment, a length of a first side of the second connection portion extending in the first direction may be less than a distance in the first direction between a second side of the second connection portion extending in a second direction crossing the first direction and a vertex of the first connection portion.

In an exemplary embodiment, the length of the first side of the second connection portion may be greater than a width in the first direction of a contact hole through which the second connection portion and the pixel circuit are connected.

According to an exemplary embodiment of the present inventive concepts, a display device includes a pixel circuit, a first line disposed on the pixel circuit, the first line extending in a first direction and a second line disposed on a same layer as the first line and extending in the first direction. The second line is spaced apart from the first line in a second direction that crosses the first direction. A light emitting element is disposed on the first line and the second line. A connection pattern is disposed on a same layer as the first line and the second line and is disposed between the first line and the second line in the second direction. The connection pattern includes a first connection portion that is configured to connect the light emitting element and a second connection portion that is configured to connect the pixel circuit. The connection pattern has a shape in which the first connection portion or the second connection portion has a first vertex that is positioned at a shortest distance from the first line to the connection pattern and all other portions of the connection pattern are positioned farther away from the first line. The first connection portion or the second connection portion has a second vertex that is positioned at a shortest distance from the second line to the connection pattern and all other portions of the connection pattern are positioned farther away from the second line.

In the display device according to exemplary embodiments of the present inventive concepts, the connection pattern may include the first connection portion connected to the light emitting element and having a diamond shape, and the first vertex of the connection pattern may be positioned at the shortest distance from the first line to the connection pattern. Accordingly, the first vertex of the connection pattern and a side of the first line may face each other although a distance between the first line and the connection pattern decreases due to the increase in resolution of the display device, so that short-circuit defects between the first line and the connection pattern may be prevented.

BRIEF DESCRIPTION OF THE DRAWINGS

Illustrative, non-limiting embodiments will be more clearly understood from the following detailed description taken in conjunction with the accompanying drawings.

DETAILED DESCRIPTION OF EXEMPLARY EMBODIMENTS

Hereinafter, display devices in accordance with exemplary embodiments of the present inventive concepts will be explained in detail with reference to the accompanying drawings.

Figure 1:
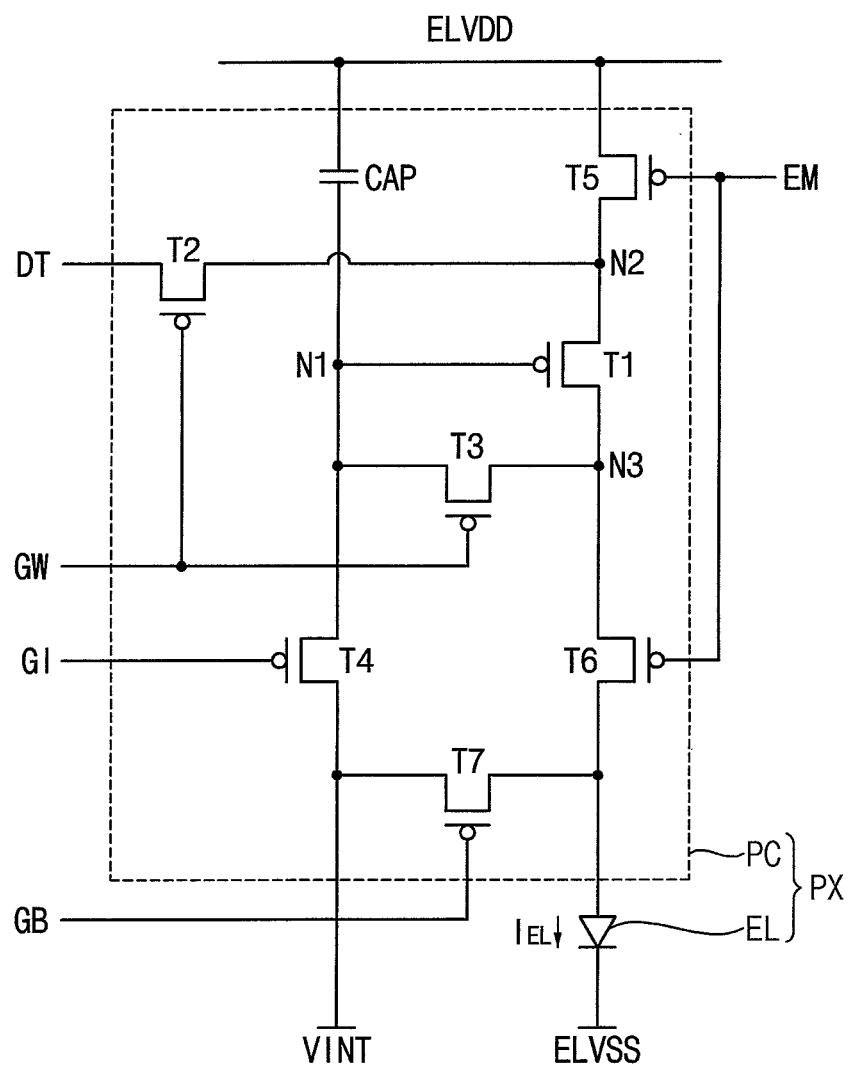
FIG. 1 is a circuit diagram illustrating a pixel included in a display device according to an exemplary embodiment of the present inventive concepts.

FIG. 1 is a circuit diagram illustrating a pixel included in a display device according to an embodiment.

Referring to FIG. 1, a display device according to an exemplary embodiment of the present inventive concepts may include a plurality of pixels PX. Each of the pixels PX may emit light, and the display device may display an image formed by light emitted from the pixels PX. Each of the pixels PX may include a light emitting element EL and a pixel circuit PC.

An anode of the light emitting element EL may be connected to the pixel circuit PC, and a cathode of the light emitting element EL may receive a second voltage ELVSS. The light emitting element EL may generate light having a predetermined luminance that corresponds to a magnitude of current $I_{EL}$ supplied from the pixel circuit PC. A first voltage ELVDD supplied to the anode of the light emitting element EL may be greater than the second voltage ELVSS to provide the current $I_{EL}$ through the light emitting element EL.

The pixel circuit PC may control the magnitude of the current $I_{EL}$ flowing from a first power source supplying the first voltage ELVDD in response to a data signal DT to a second power source supplying the second voltage ELVSS through the light emitting element EL. To control the magnitude of the current $I_{EL}$, the pixel circuit PC may include a plurality of transistors and at least one capacitor.

As shown in the exemplary embodiment of FIG. 1, the pixel circuit PC may include a first transistor T1, a second transistor T2, a third transistor T3, a fourth transistor T4, a fifth transistor T5, a sixth transistor T6, a seventh transistor T7, and a capacitor CAP. However, exemplary embodiments of the present inventive concepts are not limited thereto, and in other exemplary embodiments, the pixel circuit PC may include two to sixth or eight or more transistors and/or two or more capacitors.

The first transistor T1 may be a driving transistor providing the current IL corresponding to the data signal DT to the light emitting element EL. In an exemplary embodiment, the first transistor T1 may include a gate electrode connected to a first node N1, a first electrode connected to a second node N2, and a second electrode connected to a third node N3.

The second transistor T2 may be a switching transistor providing the data signal DT to the first transistor T1 in response to a first gate signal GW. In an exemplary embodiment, the second transistor T2 may include a gate electrode receiving the first gate signal GW, a first electrode receiving the data signal DT, and a second electrode connected to the second node N2.

The third transistor T3 may be a compensation transistor diode-connecting the gate electrode and the second electrode of the first transistor T1 in response to the first gate signal GW. In an exemplary embodiment, the third transistor T3 may include a gate electrode receiving the first gate signal GW, a first electrode connected to the first node N1, and a second electrode connected to the third node N3.

The fourth transistor T4 may be a first initialization transistor providing an initialization voltage VINT to the first transistor T1 in response to a second gate signal GI. In an exemplary embodiment, the fourth transistor T4 may include a gate electrode receiving the second gate signal GI, a first electrode receiving the initialization voltage VINT, and a second electrode connected to the first node N1.

Each of the fifth transistor T5 and the sixth transistor T6 may be an emission control transistor providing the first voltage ELVDD to the light emitting element EL in response to an emission control signal EM. In an exemplary embodiment, the fifth transistor T5 may include a gate electrode receiving the emission control signal EM, a first electrode receiving the first voltage ELVDD, and a second electrode connected to the second node N2. The sixth transistor T6 may include a gate electrode receiving the emission control signal EM, a first electrode connected to the third node N3, and a second electrode connected to the anode of the light emitting element EL.

The seventh transistor T7 may be a second initialization transistor providing the initialization voltage VINT to the light emitting element EL in response to a third gate signal GB. In an exemplary embodiment, the seventh transistor T7 may include a gate electrode receiving the third gate signal GB, a first electrode receiving the initialization voltage VINT, and a second electrode connected to the anode of the light emitting element EL.

The capacitor CAP may store a voltage corresponding to the data signal DT and a threshold voltage of the first transistor T1. In an exemplary embodiment, the capacitor CAP may include a first capacitor electrode connected to the first node N1 and a second capacitor electrode receiving the first voltage ELVDD.

In an exemplary embodiment, the first electrode of each of the first to seventh transistors T1, T2, T3, T4, T5, T6, and T7 may be any one of a source electrode and a drain electrode, and the second electrode of each of the first to seventh transistors T1, T2, T3, T4, T5, T6, and T7 may be an electrode different from the first electrode. For example, in an exemplary embodiment, the first electrode of each of the first to seventh transistors T1, T2, T3, T4, T5, T6, and T7 may be the source electrode, and the second electrode of each of the first to seventh transistors T1, T2, T3, T4, T5, T6, and T7 may be the drain electrode. Furthermore, while the gate electrodes of the first to seventh transistors T1, T2, T3, T4, T5, T6, and T7 shown in the exemplary embodiment of FIG. 1 are single gate electrodes, exemplary embodiments of the present inventive concepts are not limited thereto. For example, in other exemplary embodiments, at least one gate electrode of the first to seventh transistors T1, T2, T3, T4, T5, T6, and T7 may be dual gate electrodes, etc.

Figure 2:
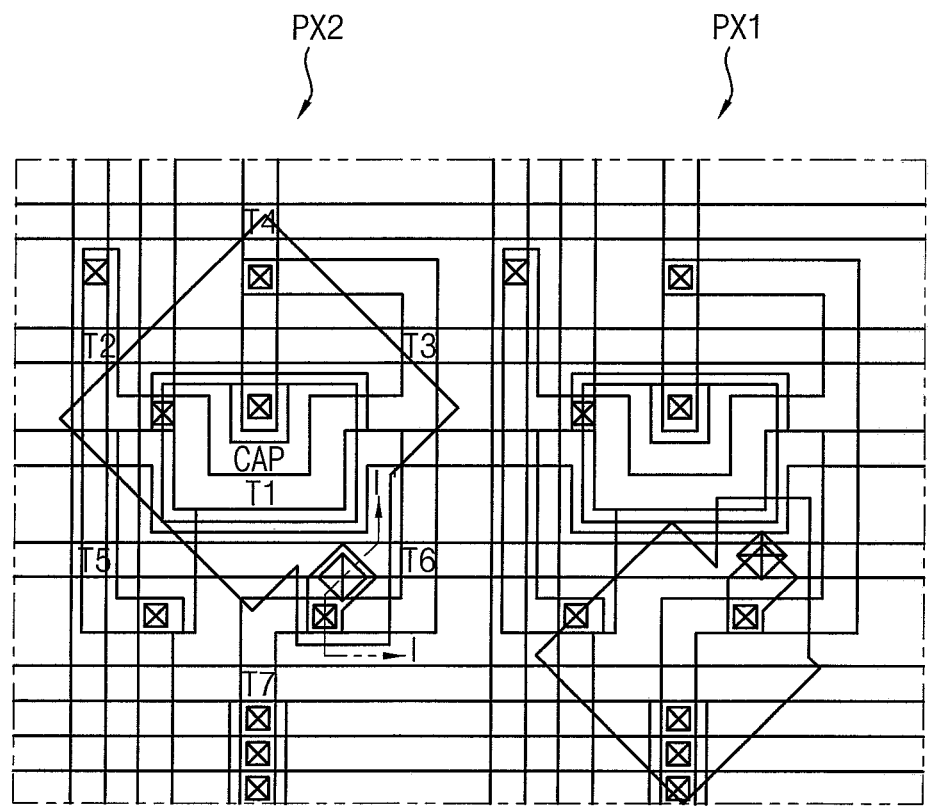
FIG. 2 is a plan view illustrating a first pixel and a second pixel included in a display device according to an exemplary embodiment of the present inventive concepts.
Figure 2:
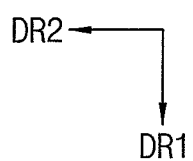
Figure 8:
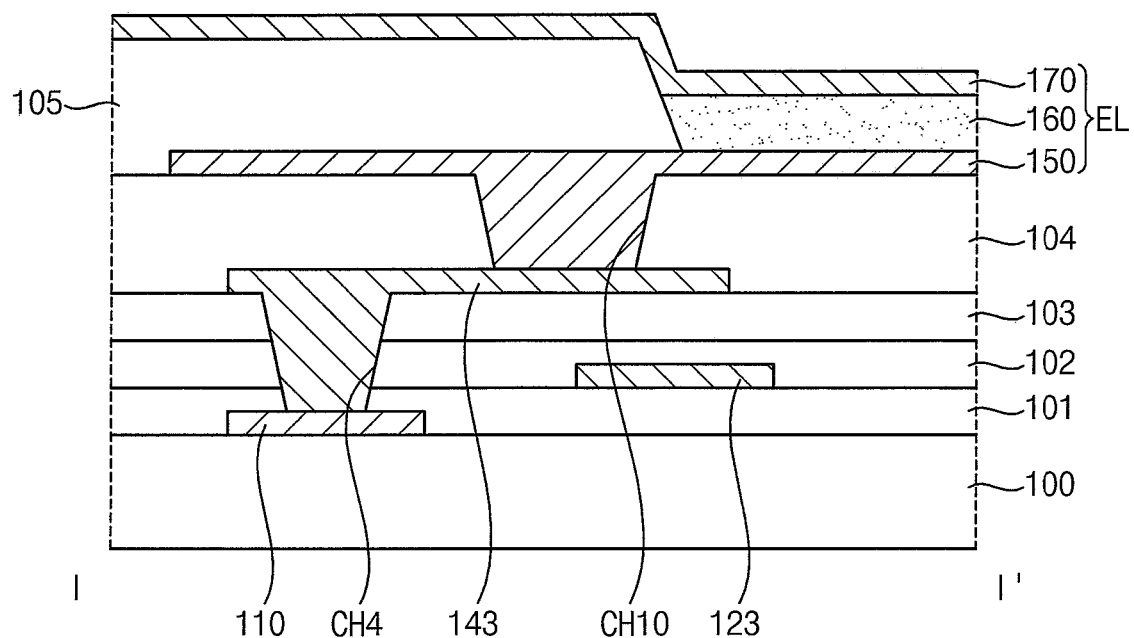
FIG. 8 is a cross-sectional view taken along a line I-I' in FIG. 2 according to an exemplary embodiment of the present inventive concepts.

FIG. 2 is a plan view illustrating a first pixel and a second pixel included in a display device according to an exemplary embodiment of the present inventive concepts. FIGS. 3, 4, 5, 6, and 7 are plan views illustrating layers of the first pixel and the second pixel illustrated in FIG. 2 according to exemplary embodiments of the present inventive concepts. FIG. 8 is a cross-sectional view taken along a line I-I' in FIG. 2 according to an exemplary embodiment of the present inventive concepts.

Referring to the exemplary embodiments of FIGS. 1, 2, 3, 4, 5, 6, 7, and 8, a display device may include a plurality of pixels PX including a first pixel PX1 and a second pixel PX2. In an exemplary embodiment, the plurality of pixels PX may be arranged in a substantial matrix form along a first direction DR1 and a second direction DR2 crossing the first direction DR1. For example, in an exemplary embodiment, the first direction DR1 may be perpendicular to the second direction DR2. The first pixel PX1 may be any one of the plurality of pixels PX, and the second pixel PX2 may be positioned adjacent to the first pixel and may be spaced apart from the first pixel PX1, for example, in the second direction DR2. Each of the first pixel PX1 and the second pixel PX2 may include the pixel circuit PC and the light emitting element EL.

An active layer 110, a first conductive layer that includes a first gate line 121, a second gate line 122, an emission control line 123, and a first capacitor electrode, a second conductive layer that includes a third gate line 131, an initialization voltage line 132, and a conductive pattern 133, a third conductive layer that includes a first line 141, a second line 142, a connection pattern 143, a gate connection pattern 144, and an initialization connection pattern 145, and a first electrode 150, an emission layer 160, and a second electrode 170 may be sequentially disposed on a substrate 100 (e.g., in a thickness direction of the substrate 100). In an exemplary embodiment, the active layer 110, the first conductive layer, and the second conductive layer may form the pixel circuit PC including the first to seventh transistors T1, T2, T3, T4, T5, T6, and T7 and the capacitor CAP. Further, the first electrode 150, the emission layer 160, and the second electrode 170 may form the light emitting element EL.

The substrate 100 may include a transparent insulating substrate. For example, the substrate 100 may be formed of a glass substrate, a quartz substrate, a plastic substrate, or the like. However, exemplary embodiments of the present inventive concepts are not limited thereto. In an exemplary embodiment, the substrate 100 may include a structure in which organic insulation layers and inorganic insulation layers are alternately stacked. For example, the substrate 100 may be formed as a structure in which a first organic insulation layer including polyimide (PI), a first inorganic insulation layer including silicon compounds and/or amorphous silicon, a second organic insulation layer including polyimide, and a second inorganic insulation layer including silicon compounds are stacked.

As shown in the exemplary embodiment of FIG. 8, the active layer 110 may be disposed on the substrate 100 (e.g., in a thickness direction of the substrate 100). In an exemplary embodiment, a buffer layer may be interposed between the substrate 100 and the active layer 110 to provide insulation therebetween. For example, the buffer layer may prevent impurities from being dispersed from the substrate 100, and may control the rate of heat transfer in a crystallization process for forming the active layer 110. In an exemplary embodiment, the buffer layer may include silicon compounds, metal oxide, or the like. However, exemplary embodiments of the present inventive concepts are not limited thereto. In some exemplary embodiments, the buffer layer may not be included in the display device. The active layer 110 may include a source region, a drain region, and a channel region of each of the first to seventh transistors T1, T2, T3, T4, T5, T6, and T7.

In an exemplary embodiment, the active layer 110 may be formed of polycrystalline silicon. For example, after an amorphous silicon layer is formed on the buffer layer, the amorphous silicon layer may be crystallized to form the polycrystalline silicon layer. The polycrystalline silicon layer may then be patterned to form the active layer 110. However, exemplary embodiments of the present inventive concepts are not limited thereto. For example, in another exemplary embodiment, the active layer 110 may be formed of an oxide semiconductor. For example, an oxide semiconductor layer is formed on the buffer layer, and the oxide semiconductor layer may be patterned to form the active layer 110.

The first conductive layer may be disposed on the active layer 110. For example, the first conductive layer may be disposed, either directly or indirectly, above the active layer 110. As shown in the exemplary embodiment of FIG. 8, a first insulation layer 101 may be interposed between the active layer 110 and the first conductive layer (e.g., in a thickness direction of the substrate 100) to provide insulation therebetween. For example, a lower surface of the first insulation layer 101 may directly contact upper and side surfaces of the active layer 110 and an upper surface of the first insulation layer 101 may directly contact a lower surface of the first conductive layer, such as the emission control line 123 shown in FIG. 8. In an exemplary embodiment, the first insulation layer 101 may include at least one material selected from silicon compounds, metal oxide, and the like.

Figure 4:
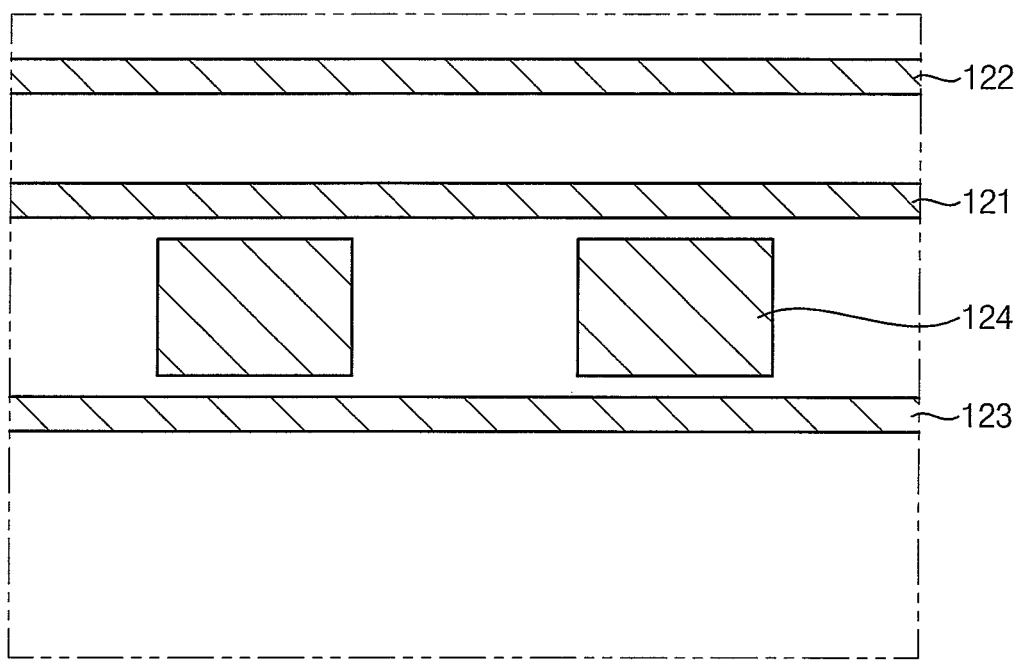
Figure 4:
Figure 5:
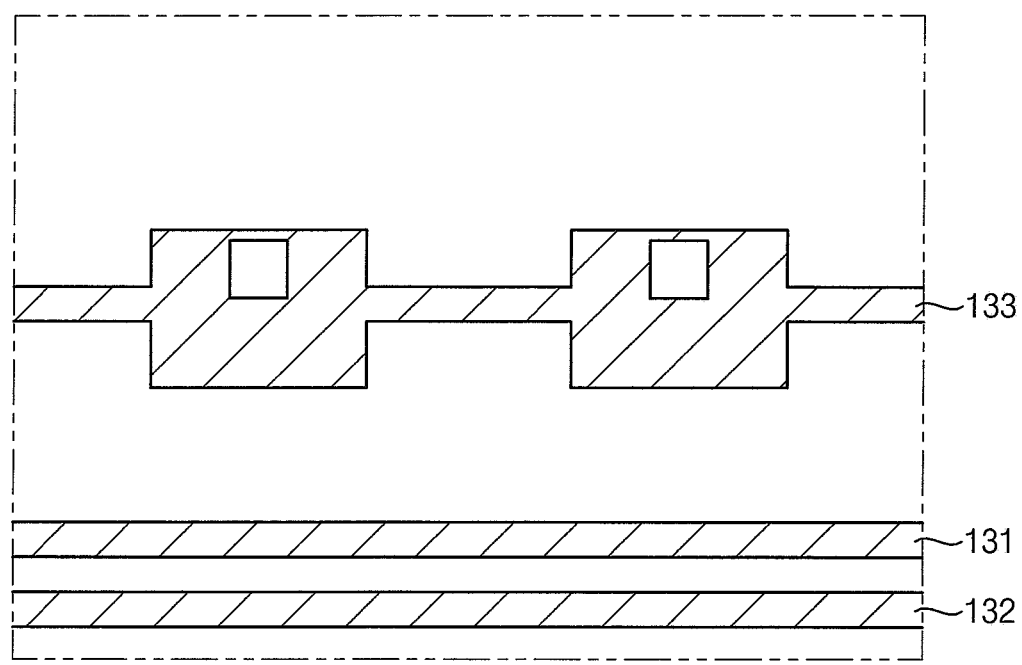
Figure 5:
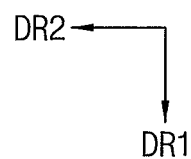

As shown in the exemplary embodiment of FIG. 4, the first gate line 121, the second gate line 122, and the emission control line 123 of the first conductive layer may be arranged in the first direction DR1 (e.g., spaced apart in the first direction DR1), and may extend in the second direction DR2. In an exemplary embodiment, the first gate line 121 may provide the first gate signal GW to the pixel circuit PC, the second gate line 122 may provide the second gate signal GI to the pixel circuit PC, and a third gate line comprising the emission control line 123 may provide the emission control signal EM to the pixel circuit PC. In an exemplary embodiment, the first conductive layer may be formed of at least one material selected from a metal, an alloy, a conductive metal nitride, a conductive metal oxide, a transparent conductive material, and the like. However, exemplary embodiments of the present inventive concepts are not limited thereto.

A portion of the first gate line 121 overlapping the active layer 110 (e.g., in a thickness direction of the substrate 100) may function as the gate electrode of the second transistor T2, and another portion of the first gate line 121 overlapping the active layer 110 (e.g., in a thickness direction of the substrate 100) may function as the gate electrode of the third transistor T3. Accordingly, the active layer 110 and the first gate line 121 may form the second transistor T2 and the third transistor T3. A portion of the second gate line 122 overlapping the active layer 110 (e.g., in a thickness direction of the substrate 100) may function as the gate electrode of the fourth transistor T4. Accordingly, the active layer 110 and the second gate line 122 may form the fourth transistor T4. A portion of the emission control line 123 overlapping the active layer 110 (e.g., in a thickness direction of the substrate 100) may function as the gate electrode of the fifth transistor T5, and another portion of the emission control line 123 overlapping the active layer 110 (e.g., in a thickness direction of the substrate 100) may function as the gate electrode of the sixth transistor T6. Accordingly, the active layer 110 and the emission control line 123 may form the fifth transistor T5 and the sixth transistor T6.

The second conductive layer may be disposed on the first conductive layer. For example, the second conductive layer may be disposed, either directly or indirectly, above the first conductive layer. A second insulation layer 102 may be interposed between the first conductive layer and the second conductive layer (e.g., in a thickness direction of the substrate 100) to provide insulation therebetween. In an exemplary embodiment, the second insulation layer 102 may include silicon compounds, metal oxide, or the like.

Figure 3:
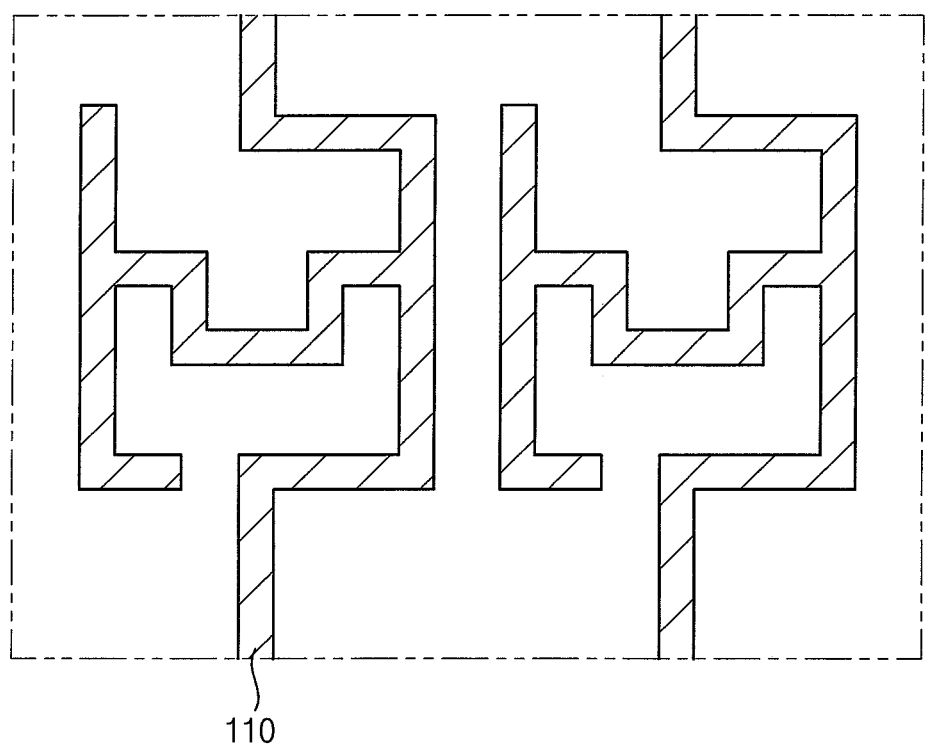
FIGS. 3, 4, 5, 6, and 7 are plan views illustrating layers of the first pixel and the second pixel shown in FIG. 2 according to exemplary embodiments of the present inventive concepts.
Figure 3:
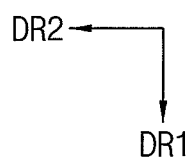

As shown in the exemplary embodiment of FIG. 3, the third gate line 131, the initialization voltage line 132, and the conductive pattern 133 of the second conductive layer may be arranged in the first direction DR1 (e.g., spaced apart in the first direction DR1), and may extend in the second direction DR2. In an exemplary embodiment, the third gate line 131 may provide the third gate signal GB to the pixel circuit PC, and the initialization voltage line 132 may provide the initialization voltage VINT to the pixel circuit PC. In an exemplary embodiment, the second conductive layer 131, 132, and 133 may be formed of metal, alloy, conductive metal nitride, conductive metal oxide, transparent conductive material, or the like. However, exemplary embodiments of the present inventive concepts are not limited thereto.

A portion of the third gate line 131 overlapping the active layer 110 (e.g., in a thickness direction of the substrate 100) may function as the gate electrode of the seventh transistor T7. Accordingly, the active layer 110 and the third gate line 131 may form the seventh transistor T7. A portion of the conductive pattern 133 overlapping the first capacitor electrode 124 (e.g., in a thickness direction of the substrate 100) may function as the second capacitor electrode of the capacitor CAP. Accordingly, the first capacitor electrode 124 and the conductive pattern 133 may form the capacitor CAP.

The third conductive layer may be disposed on the second conductive layer. For example, the third conductive layer may be disposed, either directly or indirectly, above the second conductive layer. A third insulation layer 103 may be interposed between the second conductive layer and the third conductive layer (e.g., in a thickness direction of the substrate 100) to provide insulation therebetween. The third insulation layer 103 may include silicon compounds, metal oxide, or the like.

Figure 6:
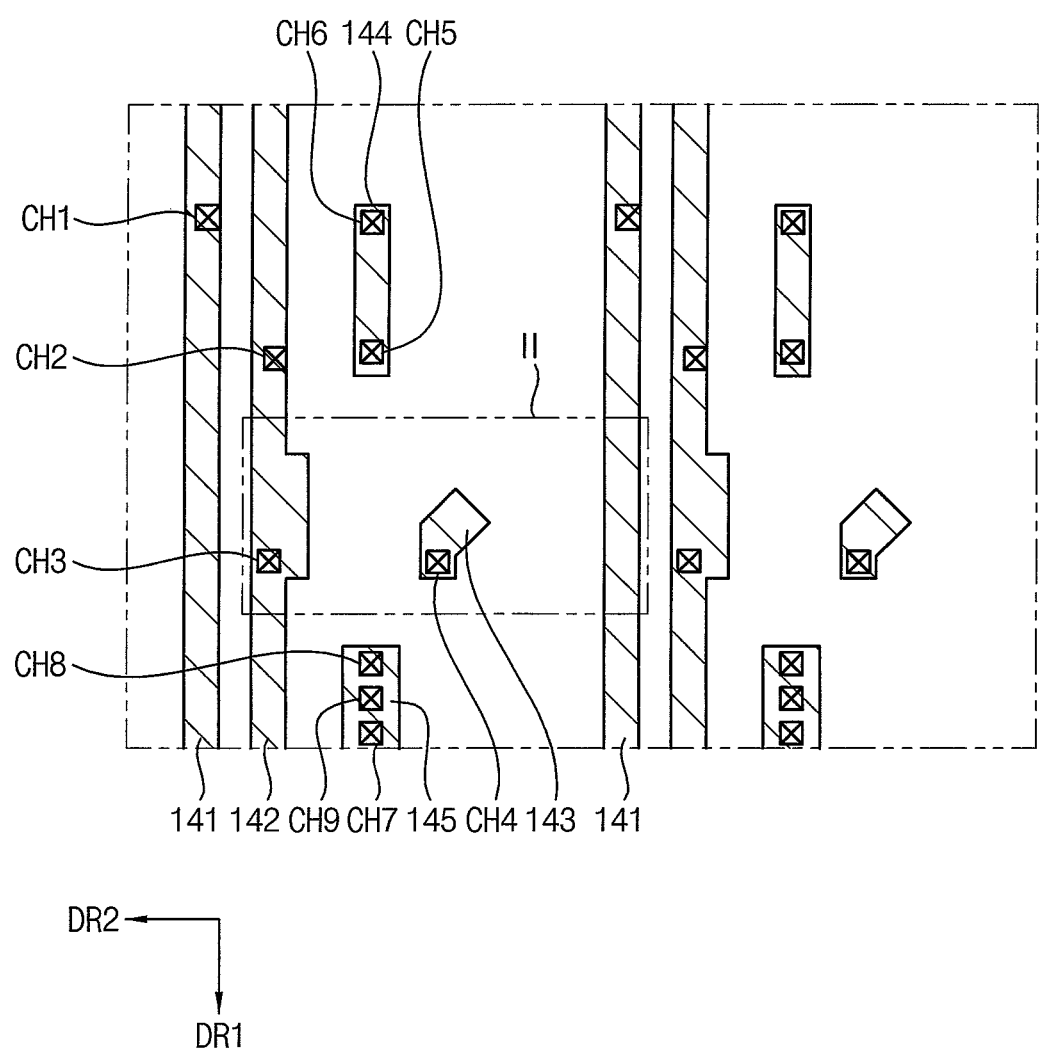
Figure 7:
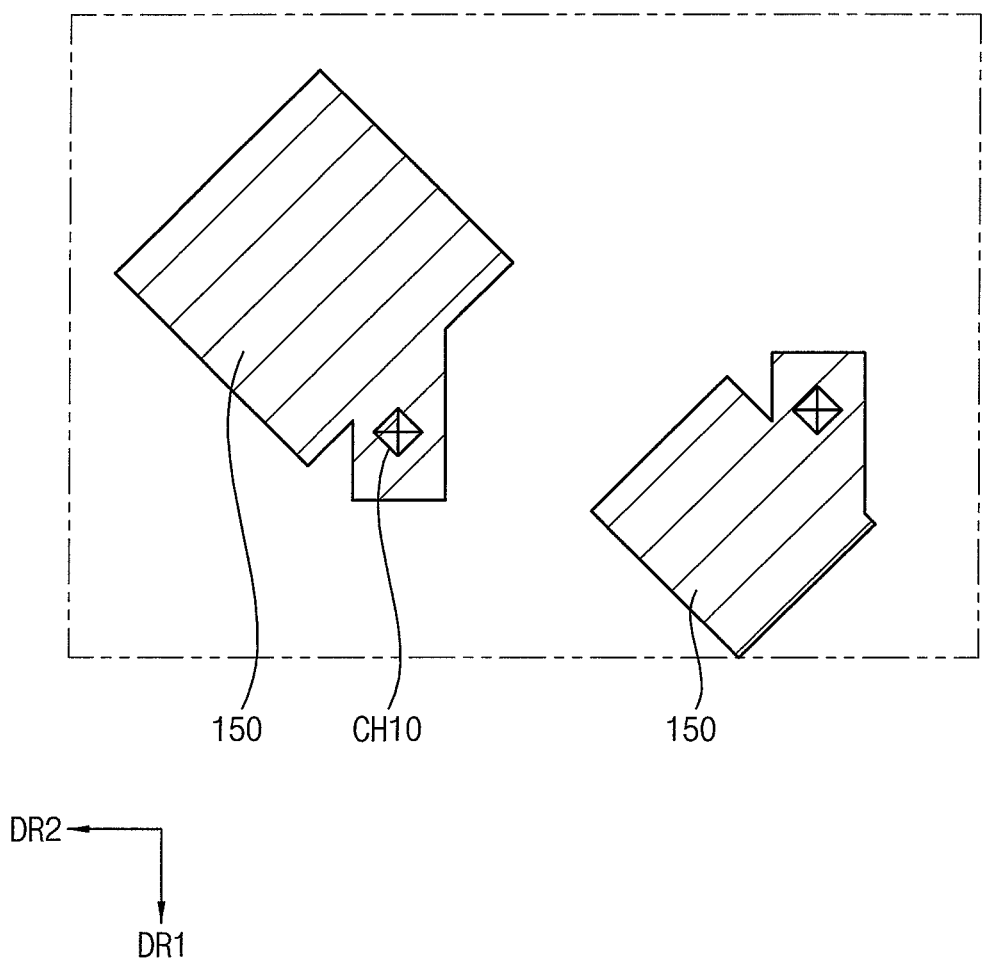

As shown in the exemplary embodiment of FIG. 6, the first line 141 and the second line 142 of the third conductive layer may be arranged in the second direction DR2 (e.g., spaced apart in the second direction DR2), and may extend in the first direction DR1. In an exemplary embodiment, the first line 141 may provide the data signal DT to the pixel circuit PC, and the second line 142 may provide a power voltage to the pixel circuit PC. For example, the power voltage may be the first voltage ELVDD. In an exemplary embodiment, the third conductive layer may be formed of metal, alloy, conductive metal nitride, conductive metal oxide, transparent conductive material, or the like. However, exemplary embodiments of the present inventive concepts are not limited thereto.

The first line 141 may be connected to the active layer 110 through a first contact hole CH1 formed in the first insulation layer 101, the second insulation layer 102, and the third insulation layer 103. The second line 142 may be connected to the conductive pattern 133 through a second contact hole CH2 formed in the third insulation layer 103, and may be connected to the active layer 110 through a third contact hole CH3 formed in the first insulation layer 101, the second insulation layer 102, and the third insulation layer 103. As shown in the exemplary embodiment of FIG. 8, the connection pattern 143 may be connected to the active layer 110 through a fourth contact hole CH4 formed in the first insulation layer 101, the second insulation layer 102, and the third insulation layer 103. The gate connection pattern 144 may be connected to the first capacitor electrode 124 through a fifth contact hole CH5 formed in the second insulation layer 102 and the third insulation layer 103, and may be connected to the active layer 110 through a sixth contact hole CH6 formed in the first insulation layer 101, the second insulation layer 102, and the third insulation layer 103. The initialization connection pattern 145 may be connected to the active layer 110 through a seventh contact hole CH7 and an eighth contact hole CH8 formed in the first insulation layer 101, the second insulation layer 102, and the third insulation layer 103, and may be connected to the initialization voltage line 132 through a ninth contact hole CH9 formed in the third insulation layer 103.

The first electrode 150 may be disposed on the third conductive layer 141, 142, 143, 144, and 145. For example, the first electrode 150 may be disposed, either directly or indirectly, above the third conductive layer. A fourth insulation layer 104 may be interposed between the third conductive layer 141, 142, 143, 144, and 145 and the first electrode 150 (e.g., in a thickness direction of the substrate 100) to provide insulation therebetween. In an exemplary embodiment, the fourth insulation layer 104 may include polyimide or the like. However, exemplary embodiments of the present inventive concepts are not limited thereto.

In an exemplary embodiment, the first electrode 150 may be formed of at least one material selected from a metal, alloy, conductive metal nitride, conductive metal oxide, transparent conductive material, or the like. For example, the first electrode 150 may include silver (Ag), indium tin oxide (ITO), or the like. However, exemplary embodiments of the present inventive concepts are not limited thereto. The first electrode 150 may be connected to the connection pattern 143 through a tenth contact hole CH10 formed in the fourth insulation layer 104.

A fifth insulation layer 105 may be disposed on the first electrode 150. For example, as shown in the exemplary embodiment of FIG. 8, the fifth insulation layer 105 may directly contact upper and side surfaces of the first electrode 150. The fifth insulation layer 105 may cover the first electrode 150, and may be disposed on the fourth insulation layer 104. The fifth insulation layer 105 may have a pixel opening exposing at least a portion of the first electrode 150. In an exemplary embodiment, the pixel opening may expose a central portion of the first electrode 150, and may cover a peripheral portion of the first electrode 150. In an exemplary embodiment, the fifth insulation layer 105 may be formed of polyimide or the like. However, exemplary embodiments of the present inventive concepts are not limited thereto.

The emission layer 160 may be disposed on the first electrode 150. The emission layer 160 may be disposed on the first electrode 150 exposed by the pixel opening. For example, as shown in the exemplary embodiment of FIG. 8, a lower surface of the emission layer 160 may directly contact an upper surface of the first electrode 150 that is exposed by the pixel opening. Lateral side surfaces of the emission layer 160 may directly contact lower portions of the lateral side surfaces of the fifth insulation layer 105 forming the pixel opening. In an exemplary embodiment, the emission layer 160 may include at least one of an organic light emitting material and a quantum dot. However, exemplary embodiments of the present inventive concepts are not limited thereto.

In an exemplary embodiment, the organic light emitting material may include a low molecular organic compound or a high molecular organic compound. For example, the low molecular organic compound may include at least one compound selected from copper phthalocyanine, diphenylbenzidine (N, N'-diphenylbenzidine), trihydroxyquinoline aluminum (tris-(8-hydroxyquinoline)aluminum), and the like. The high molecular organic compound may include at least one compound selected from poly ethylenedioxythiophene (poly(3,4-ethylenedioxythiophene), polyaniline, polyphenylenevinylene, polyfluorene, and the like.

In an exemplary embodiment, the quantum dot may include a core including a group II-VI compound, a group III-V compound, a group IV-VI compound, a group IV element, a group IV compound, and a combination thereof. In one exemplary embodiment, the quantum dot can have a core-shell structure including a core and a shell surrounding the core. The shell may prevent chemical denaturation of the core, thereby serving as a protective layer for maintaining semiconductor characteristics and a charging layer for imparting electrophoretic characteristics to the quantum dot.

The second electrode 170 may be disposed on the emission layer 160. In an exemplary embodiment, the second electrode 170 may also be disposed on the fifth insulation layer 105. For example, as shown in the exemplary embodiment of FIG. 8, lower surfaces of the second electrode 170 may directly contact an upper surface of the emission layer 160, an upper surface of the fifth insulating layer 105 and upper portions of the lateral side surfaces of the fifth insulating layer 105 forming the pixel opening. In an exemplary embodiment, the second electrode 170 may include a conductive material such as at least one material selected from metal, alloy, transparent conductive oxide, or the like. For example, the second electrode 170 may include at least one compound selected from aluminum (Al), platinum (Pt), silver (Ag), magnesium (Mg), gold (Au), chromium (Cr), tungsten (W), titanium (Ti), and the like. The first electrode 150, the emission layer 160, and the second electrode 170 may form the light emitting element EL.

Figure 9:
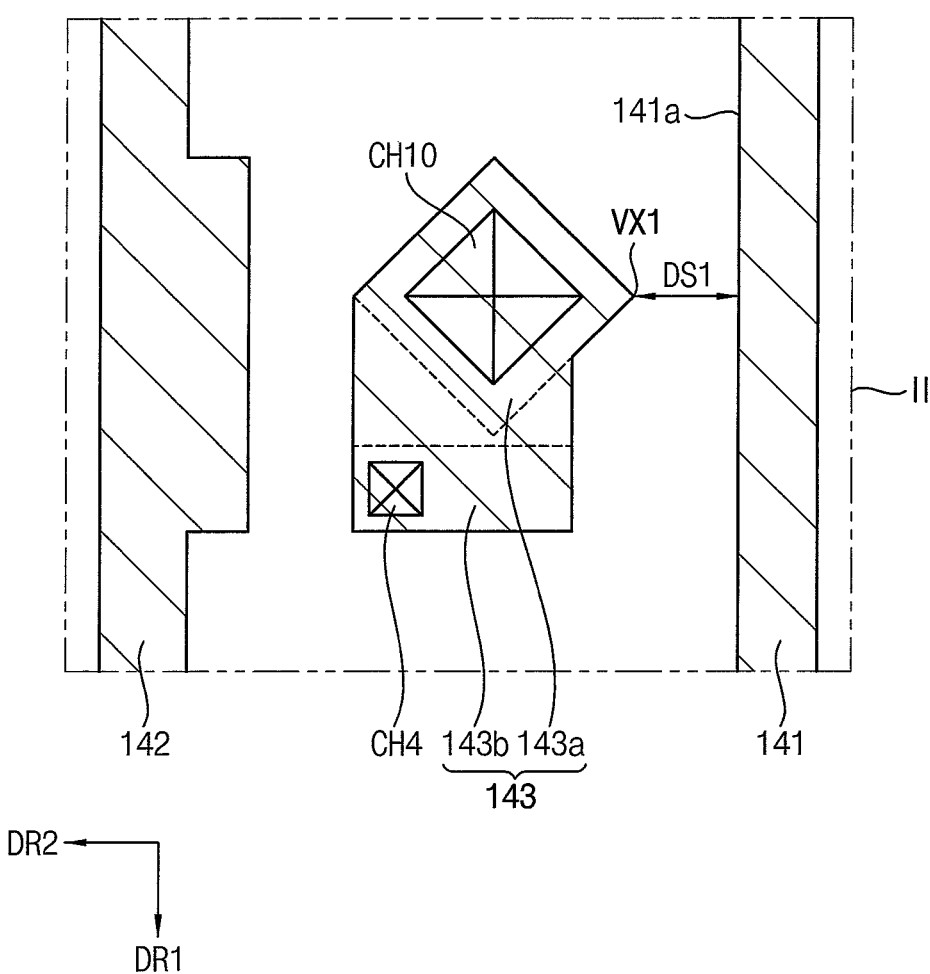
FIG. 9 is a magnified plan view of area II of FIG. 6 according to an exemplary embodiment of the present inventive concepts.

FIG. 9 is a magnified plan view illustrating a first line, a second line, and a connection pattern according to an exemplary embodiment of the present inventive concepts. For example, FIG. 9 may illustrate an example of area II in FIG. 6.

Referring to the exemplary embodiments of FIGS. 1-9, the first line 141, the second line 142, and the connection pattern 143 may be disposed between the pixel circuit PC and the light emitting element EL (e.g., in a thickness direction of the substrate 100). The first line 141, the second line 142, and the connection pattern 143 may be disposed on the pixel circuit PC. For example, the first line 141, the second line 142 and the connection pattern 132 may be disposed, either directly or indirectly, above the pixel circuit PC. The light emitting element EL may be disposed on the first line 141, the second line 142, and the connection pattern 143. For example, the light emitting element EL may be disposed, either directly or indirectly, above the first line 141, the second line 142 and the connection pattern 143. As shown in the exemplary embodiments of FIGS. 6 and 9, the second line 142 may be disposed on the same layer as the first line 141, and may be spaced apart from the first line 141 in the second direction DR2 and may extend parallel to the first line 141. For example, the first line 141 and the second line may both extend substantially parallel to the first direction DR1. The connection pattern 143 may be disposed on the same layer as the first line 141 and the second line 142, and may be disposed between the first line 141 and the second line 142 (e.g., in the second direction DR2).

In an exemplary embodiment, the first line 141 may be connected to the first pixel PX1, and the second line 142 may be connected to the second pixel PX2. In this embodiment, the connection pattern 143 may connect the pixel circuit PC and the light emitting element EL of the second pixel PX2.

As shown in the exemplary embodiment of FIG. 9, the connection pattern 143 may have a polygonal shape including at least six sides in a plan view (e.g., in a plan view defined by the first direction DR1 and the second direction DR2). In an exemplary embodiment, the connection pattern 143 may have a hexagonal shape. In this embodiment, the connection pattern 143 may have six vertices.

The connection pattern 143 may include a first connection portion 143a connected to the light emitting element EL and a second connection portion 143b connected to the pixel circuit PC. The first connection portion 143a may be connected to the first electrode 150 of the light emitting element EL through the tenth contact hole CH10, and the second connection portion 143b may be connected to the active layer 110 of the pixel circuit PC through the fourth contact hole CH4.

As shown in the exemplary embodiment of FIG. 9, the first connection portion 143a may have a diamond shape in a plan view (e.g., in a plan view defined by the first direction DR1 and the second direction DR2). For example, sides of the first connection portion 143a may extend in directions between the first direction DR1 and the second direction DR2 which are not parallel thereto. The vertices of the first connection portion 143a may be spaced apart in the first direction DR1 or the second direction DR2 from a center of the first connection portion 143a.

In an exemplary embodiment, the tenth contact hole CH10 may have a diamond shape similar to the shape of the first connection portion 143a in a plan view. For example, an area of the tenth contact hole CH10 may be less than an area of the first connection portion 143a. As shown in the exemplary embodiment of FIG. 9, each of the sides of the tenth contact hole CH10 (e.g., side surfaces extending between the vertices of the tenth contact hole CH10) may be spaced apart from the adjacent side edges of the first connection portion 143a by a same distance. However, exemplary embodiments of the present inventive concepts are not limited thereto.

A first vertex VX1 of the connection pattern 143 may be positioned at a shortest distance DS1 (e.g., a length in second direction DR2) from the first line 141 to the connection pattern 143. The closest point from the first line 141 among edges of the connection pattern 143 may be the first vertex VX1 and the edges of the connection pattern 143 between the first vertex VX1 and each adjacent vertex may be positioned farther from the first line 141 (e.g., in the second direction DR2) than the first vertex VX1. In the exemplary embodiment shown in FIG. 9, the first vertex of the connection pattern 143 may face aside 141a of the first line 141. For example, the side 141a may be an inner side edge that extends substantially in the first direction DR1 and is closest to the adjacent second line 142 which the connection pattern 143 is positioned therebetween (e.g., in the second direction DR2). The lower portion (e.g., in the first direction DR1) of the connection pattern 143 connected to the first connection portion 143a may be rectangular shaped and may have a side adjacent to the first line 141 that extends substantially in the first direction DR1 and is positioned farther from the first line 141 (e.g., in the second direction DR2) than the first vertex VX1. However, in other exemplary embodiments, the lower portion of the connection pattern 143 may have other shapes in which the side adjacent to the first line is positioned farther from the first line 141 than the first vertex VX1.

In a comparative example, the connection pattern may have a rectangular shape in a plan view which is arranged such that sides of the connection pattern extending in the first direction DR1 may face an adjacent side of the first line or a side of the second line extending in the first direction DR1. In the comparative example, a distance between the first line and the connection pattern and a distance between the second line and the connection pattern may decrease due to the increase in resolution of the display device. Therefore, a distance between the adjacent side of the first line and the entire side of the connection pattern facing the first line and a distance between the side of the second line and the entire side of the connection pattern facing each other may decrease. In this comparative embodiment, short-circuit defects may occur between the first line and the connection pattern and/or between the second line and the connection pattern, such as due to a tolerance in an etching process, particles generated in the etching process, or the like for forming the first line, the second line, and the connection pattern which are disposed on the same layer.

However, in the exemplary embodiment of the present inventive concepts shown in FIG. 9, the first connection portion 143a of the connection pattern 143 may have a diamond shape in a plan view, and the first vertex VX1 of the connection pattern 143 may be positioned at the shortest distance DS1 from the first line 141 to the connection pattern 143. Accordingly, even in instances in which the distance between the first line 141 and the connection pattern 143 decreases due to the increase in resolution of the display device, only the vertex VX1 of the connection pattern 143 and the side 141a of the first line 141 face each other and the side surfaces of the first connection pattern 143 extending between the vertex VX1 and the adjacent vertices are spaced farther apart from the adjacent side edge of the first line 141. Therefore, short-circuit defects between the first line 141 and the connection pattern 143 may be prevented.

Figure 10:
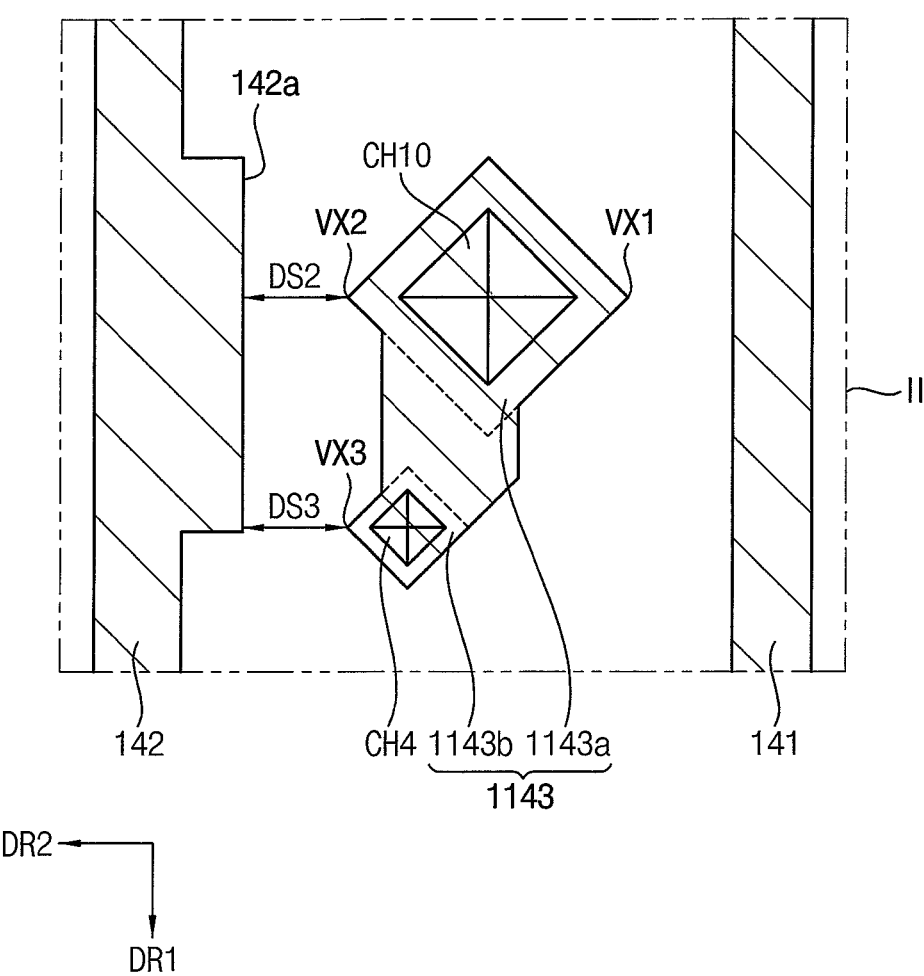
FIG. 10 is a magnified plan view illustrating a first line, a second line, and a connection pattern according to an exemplary embodiment of the present inventive concepts.

FIG. 10 is a magnified plan view illustrating a first line, a second line, and a connection pattern according to an exemplary embodiment of the present inventive concepts. For example, FIG. 10 may illustrate another example of the area II in FIG. 6 according to another exemplary embodiment of the present inventive concepts.

Referring to the exemplary embodiments of FIGS. 1, 2, 3, 4, 5, 6, 7, 8, and 10, the first line 141, the second line 142, and a connection pattern 1143 may be disposed between the pixel circuit PC and the light emitting element EL (e.g., in a thickness direction of the substrate 100). Descriptions of the first line 141, the second line 142, and the connection pattern 1143 described with reference to the exemplary embodiment of FIG. 10, which are substantially the same as or similar to the first line 141, the second line 142, and the connection pattern 143 described with reference to the exemplary embodiment of FIG. 9, will be omitted.

The connection pattern 1143 may have a polygonal shape including at least six sides in a plan view. In an exemplary embodiment, the connection pattern 143 may have an enneagonal shape. In this exemplary embodiment, the connection pattern 1143 may have nine vertices.

The connection pattern 1143 may include a first connection portion 1143a connected to the light emitting element EL and a second connection portion 1143b connected to the pixel circuit PC.

The first connection portion 1143a may have a diamond shape in a plan view (e.g., in a plane defined by the first direction DR1 and the second direction DR2) as described with respect to the exemplary embodiment of FIG. 9. The second connection portion 1143b may have a diamond shape in a plan view (e.g., in a plane defined by the first direction DR1 and the second direction DR2). For example, sides of the second connection portion 1143b may extend in directions between the first direction DR1 and the second direction DR2, and vertices of the second connection portion 1143b may be spaced apart in the first direction DR1 or the second direction DR2 from a center of the second connection portion 1143b.

In an exemplary embodiment, the fourth contact hole CH4 may have a diamond shape similar to the shape of the second connection portion 1143b in a plan view (e.g., in a plane defined by the first direction DR1 and the second direction DR2). For example, an area of the fourth contact hole CH4 may be less than an area of the second connection portion 1143b. As shown in the exemplary embodiment of FIG. 10, each of the sides of the fourth contact hole CH4

(e.g., side surfaces extending between the vertices of the fourth contact hole CH4) may be spaced apart from the adjacent side edges of the second connection portion 143b by a same distance. However, exemplary embodiments of the present inventive concepts are not limited thereto.

A second vertex VX2 of the first connection portion 1143a (e.g., the vertex opposite to the first vertex VX1 in the second direction DR2) may be positioned at a shortest distance DS2 from the second line 142 to the connection pattern 143 (e.g., in the second direction DR2). The closest point to the second line 142 among edges of the connection pattern 1143 may be the second vertex VX2. In this exemplary embodiment, the second vertex VX2 of the connection pattern 1143 may face a side 142a of the second line 142. For example, the side 142a may be an inner side edge that extends substantially in the first direction DR1 and is closest to the adjacent first line 141 which the connection pattern 143 is positioned therebetween (e.g., in the second direction DR2).

In an exemplary embodiment, the second vertex VX2 of the first connection portion 1143a may be positioned at the shortest distance DS2 from the second line 142 to the connection pattern 1143.

In another exemplary embodiment, a third vertex VX3 of the second connection portion 1143b may be positioned at the shortest distance DS3 (e.g., length in the second direction DR2) from the second line 142 to the connection pattern 1143. However, in an exemplary embodiment, the distance between the third vertex VX3 of the second connection portion 1143b and the second line 142 and the distance between the second vertex VX2 of the first connection portion 1143a and the second line 142 may be the same and the second vertex VX2 and third vertex VX3 may both be positioned a shortest distance from the second line 142. The portion of the connection pattern 1143 between the first connection portion 143a and the second connection portion 1143b may be rectangular shaped and may have a side adjacent to the second line 142 that extends substantially in the first direction DR1 and is positioned farther from the second line 142 (e.g., in the second direction DR2) than the second vertex VX2 and/or the third vertex VX3 which has the shortest distance from the second line 142.

In the exemplary embodiment of FIG. 10, the second connection portion 1143b of the connection pattern 1143 may have the diamond shape in a plan view, and the second vertex VX2 of the first connection portion 1143a and/or the third vertex VX3 of the second connection portion 1143b may be positioned at the shortest distance DS2 and/or DS3 from the second line 142 to the connection pattern 1143. Accordingly, since only the second vertex VX2 of the connection pattern 1143 and/or the third vertex VX3 of the connection pattern 1143 and the side 142a of the second line 142 face each other and the side surfaces of the first connection portion 1143a extending between the second vertex VX2 and the adjacent vertices and/or the third vertex VX3 and the adjacent vertices are positioned farther apart from the adjacent side 142a of the second line 142 although the distance between the second line 142 and the connection pattern 143 decreases due to the increase in resolution of the display device, short-circuit defects between the second line 142 and the connection pattern 1143 may be prevented.

Figure 11:
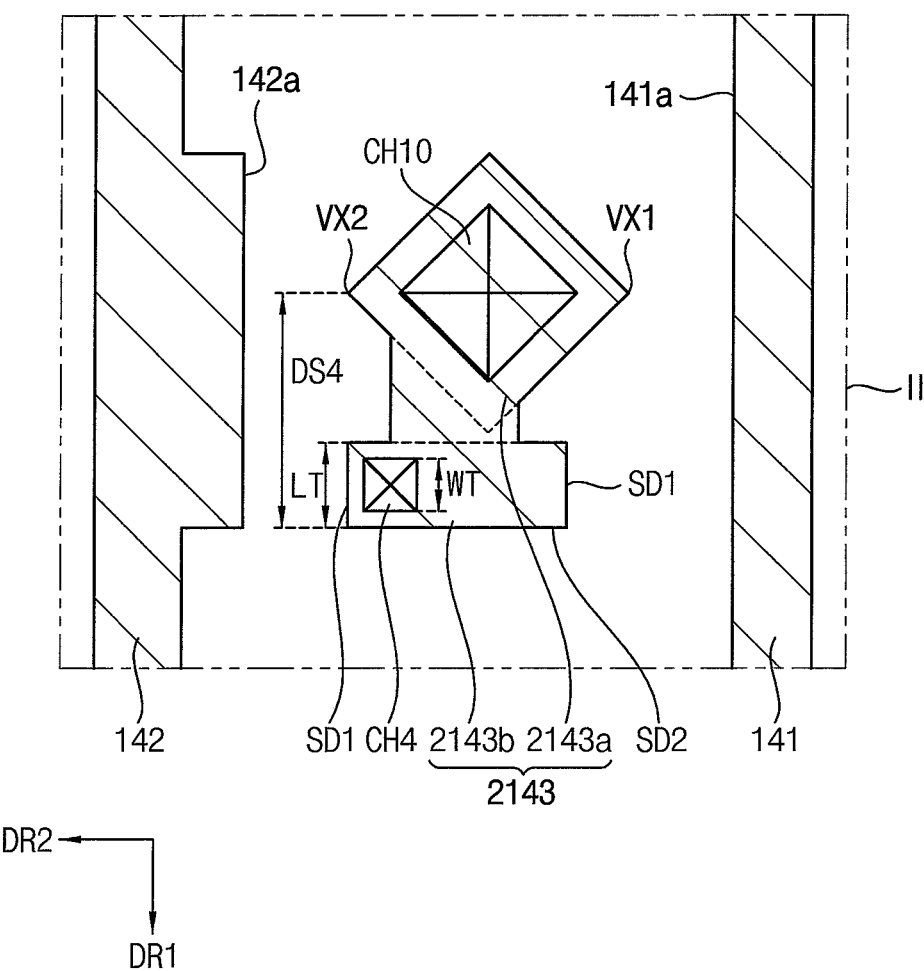
FIG. 11 is a magnified plan view illustrating a first line, a second line, and a connection pattern according to an exemplary embodiment of the present inventive concepts.

FIG. 11 is a magnified plan view illustrating a first line, a second line, and a connection pattern according to an exemplary embodiment of the present inventive concepts. For example, FIG. 11 may illustrate still another example of the area II in FIG. 6 according to another exemplary embodiment of the present inventive concepts.

Referring to the exemplary embodiments of FIGS. 1, 2, 3, 4, 5, 6, 7, 8, and 11, the first line 141, the second line 142, and a connection pattern 2143 may be disposed between the pixel circuit PC and the light emitting element EL (e.g., in a thickness direction of the substrate 100). Descriptions of the first line 141, the second line 142, and the connection pattern 2143 described with reference to the exemplary embodiment of FIG. 11, which are substantially the same as or similar to the first line 141, the second line 142, and the connection pattern 143 described with reference to the exemplary embodiment of FIG. 9, will be omitted.

The connection pattern 2143 may have a polygonal shape including at least six sides in a plan view (e.g., in a plane defined by the first direction DR1 and the second direction DR2). In an exemplary embodiment, the connection pattern 2143 may have a hendecagonal shape. In this exemplary embodiment, the connection pattern 2143 may have eleven vertices.

The connection pattern 2143 may include a first connection portion 2143a connected to the light emitting element EL and a second connection portion 2143b connected to the pixel circuit PC.

The second connection portion 2143b may have a rectangular shape in a plan view (e.g., in a plane defined by the first direction DR1 and the second direction DR2). For example, the second connection portion 2143b may have first sides SD1 adjacent to the first line 141 and the second line 142 and extending in the first direction DR1 and an adjacent second side SD2 forming a bottom side of the second connection portion extending in the second direction DR2.

In an exemplary embodiment, the fourth contact hole CH4 may have a rectangular shape like the shape of the second connection portion 2143b in a plan view. For example, an area of the fourth contact hole CH4 may be less than an area of the second connection portion 2143b. In another exemplary embodiment as shown in FIG. 11, the fourth contact hole CH4 may have a substantially square shape and is spaced apart (e.g., in the second direction DR2) from a center portion of the second connection portion 2143b. For example, the fourth contact hole CH4 may be adjacent to the first side SD1 which is adjacent to the second line 142.

In an exemplary embodiment, a length LT (e.g., in the first direction DR1) of the first side SD1 of the second connection portion 2143b may be less than a distance DS4 in the first direction DR1 between the second side SD2 of the second connection portion 2143b and the second vertex VX2 of the first connection portion 2143a. The portion of the connection pattern 2143 between the first connection portion 2143a and the second connection portion 2143b may be rectangular shaped and may have a first side adjacent to the second line 142 and a second side adjacent to the first line 141 that extend substantially in the first direction DR1 and are positioned farther from the first line 141 and the second line 142 (e.g., in the second direction DR2) than the first vertex VX1 and the second vertex VX2, respectively.

In an exemplary embodiment, the length LT of the first side SD1 of the second connection portion 2143b may be greater than a width WT in the first direction DR1 of the fourth contact hole CH4. Since the length LT of the first side SD1 of the second connection portion 2143b is greater than the width WT in the first direction DR1 of the fourth contact hole CH4, the second connection portion 2143b may fill the entirety of the fourth contact hole CH4.

In the exemplary embodiment shown in FIG. 11, the second connection portion 2143b of the connection pattern 2143 may have the rectangular shape in a plan view, and the length LT of the first side SD1 of the second connection portion 2143*b* may be less than the distance DS4 in the first direction DR1 between the second side SD2 of the second connection portion 2143*b* and the vertex of the first connection portion 2143*a*. Accordingly, since the length LT of the first sides SD1 of the second connection portion 2143*b*, which face the side 141*a* of the first line 141 and the side 142*a* of the second line 142, decreases although the distance between the first line 141 and the connection pattern 2143 and the distance between the second line 142 and the connection pattern 2143 decrease due to the increase in resolution of the display device, short-circuit defects between the first line 141 and the connection pattern 2143 and between the second line 142 and the connection pattern 2143 may be prevented.

While the exemplary embodiments shown in FIGS. 9-11 illustrate specific shapes for the connection patterns 143, 1143, 2143, such as a diamond shape for the first connection portion, exemplary embodiments of the present inventive concepts are not limited thereto. For example, in other exemplary embodiments, the connection pattern may have other shapes in which the first connection portion and/or the second connection portion have a vertex that is positioned at a shortest distance from the first line to the connection pattern and/or a vertex that is positioned at a shortest distance from the second line to the connection pattern and portions of the connection pattern between the vertex having the shortest distance and adjacent vertices are positioned farther from the first line or second line, respectively, than the vertex having the shortest distance thereto. For example, in an exemplary embodiment, all other portions of the connection pattern may be positioned farther away from the first line than the vertex having the shortest distance to the first line and all other portions of the connection may be positioned farther away from the second line than the vertex having the shortest distance to the second line.

In an exemplary embodiment of the present inventive concepts, the display device may be applied to an electronic device, such as a computer, a notebook, a mobile phone, a smartphone, a smart pad, a PMP, a PDA, an MP3 player, or the like. However, exemplary embodiments of the present inventive concepts are not limited thereto.

Although the display device according to the exemplary embodiments have been described with reference to the drawings, the illustrated embodiments are examples, and may be modified and changed by a person having ordinary knowledge in the relevant technical field without departing from the present inventive concepts.

What is claimed is:

1. A display device, comprising:
a pixel circuit;
a first line disposed on the pixel circuit, the first line extending in a first direction;
a second line disposed on a same layer as the first line and extending in the first direction, the second line is spaced apart from the first line in a second direction that crosses the first direction;
a light emitting element disposed on the first line and the second line; and
a connection pattern disposed on a same layer as the first line and the second line and disposed between the first line and the second line in the second direction, the connection pattern directly contacts the light emitting element and is configured to connect the pixel circuit and the light emitting element, the connection pattern having a polygonal shape including at least six sides, wherein a single first vertex of the connection pattern is positioned at a shortest distance from the first line to the connection pattern and all other portions of the connection pattern except for the first vertex are positioned farther from the first line than the first vertex.

2. The display device of claim 1, wherein a second vertex of the connection pattern is positioned at a shortest distance from the second line to the connection pattern and portions of the connection pattern between the second vertex and adjacent vertices are positioned farther from the second line than the second vertex.

3. The display device of claim 2, wherein the connection pattern includes:
a first connection portion connected to the light emitting element; and
a second connection portion connected to the pixel circuit, wherein the first connection portion has a diamond shape.

4. The display device of claim 3, wherein the first connection portion includes the first vertex.

5. The display device of claim 3, wherein the first connection portion includes the second vertex.

6. The display device of claim 3, wherein the second connection portion has a diamond shape.

7. The display device of claim 6, wherein the second connection portion includes the second vertex.

8. The display device of claim 3, wherein the second connection portion has a rectangular shape.

9. The display device of claim 1, wherein the first line is a data line that is configured to provide a data signal to the pixel circuit.

10. The display device of claim 1, wherein the second line is a power line that is configured to provide a power voltage to the pixel circuit.

11. The display device of claim 1, further comprising:
a first pixel and a second pixel that are spaced apart from each other in the second direction,
wherein the first line is connected to the first pixel; and
wherein the second line is connected to the second pixel.

12. The display device of claim 1, wherein:
the light emitting element includes a first electrode, an emission layer disposed on the first electrode, and a second electrode disposed on the emission layer; and
the connection pattern is directly connected to the first electrode.

13. A display device, comprising:
a pixel circuit;
a first line disposed on the pixel circuit, the first line extending in a first direction;
a second line disposed on a same layer as the first line and extending in the first direction, the second line is spaced apart from the first line in a second direction that crosses the first direction;
a light emitting element disposed on the first line and the second line; and
a connection pattern disposed on a same layer as the first line and the second line and disposed between the first line and the second line in the second direction, the connection pattern including a first connection portion that directly contacts the light emitting element and is configured to connect the light emitting element and a second connection portion that is configured to connect the pixel circuit,
wherein the first connection portion has a diamond shape in a plane defined in the first and second directions, wherein a single first vertex of the first connection portion is positioned at a shortest distance from the first line to the connection pattern and all other portions of the first connection portion except for the first vertex are positioned farther from the first line than the first vertex.

14. The display device of claim 13, wherein a second vertex of the first connection portion is positioned at a shortest distance from the second line to the connection pattern and portions of the first connection portion between the second vertex and adjacent vertices are positioned farther from the second line than the second vertex.

15. The display device of claim 13, wherein the second connection portion has a diamond shape.

16. The display device of claim 15, wherein a second vertex of the second connection portion is positioned at a shortest distance from the second line to the connection pattern and portions of the second connection portion between the second vertex and adjacent vertices are positioned farther from the second line than the second vertex.

17. The display device of claim 13, wherein the second connection portion has a rectangular shape.

18. The display device of claim 17, wherein a length of a first side of the second connection portion extending in the first direction is less than a distance in the first direction between a second side of the second connection portion extending in the second direction and a vertex of the first connection portion.

19. The display device of claim 13, wherein a first vertex of the first connection portion and a second vertex of the second connection portion are each positioned at a shortest distance from the second line to the connection pattern and all other portions of the connection pattern are positioned farther away from the second line.

20. A display device, comprising:
a pixel circuit;
a first line disposed on the pixel circuit, the firstline: extending in a first direction;
a second line disposed on a same layer as the first line and extending in the first direction, the second line is spaced apart from the first line in a second direction that crosses the first direction;
a light emitting element disposed on the first line and the second line;
a connection pattern disposed on a same layer as the first line and the second line and disposed between the first line and the second line in the second direction, the connection pattern including a first connection portion that directly contacts the light emitting element and is configured to connect the light emitting element and a second connection portion that is configured to connect the pixel circuit;
the connection pattern having a shape in which the first connection portion or the second connection portion has a single first vertex that is positioned at a shortest distance from the first line to the connection pattern and all other portions of the connection pattern except for the first vertex are positioned farther away from the first line; and
the first connection portion or the second connection portion has a second vertex that is positioned at a shortest distance from the second line to the connection pattern and all other portions of the connection pattern except for the second vertex are positioned farther away from the second line.

* * * * *